(12) United States Patent
Spijker et al.

(10) Patent No.: US 6,959,064 B2
(45) Date of Patent: Oct. 25, 2005

(54) CLOCK RECOVERY PLL

(75) Inventors: Menno Spijker, Ottawa (CA); George Jeffrey, Ottawa (CA)

(73) Assignee: Zarlink Semiconductor Inc., Kanata (CA)

( * ) Notice: Subject to any disclaimer, the term of this patent is extended or adjusted under 35 U.S.C. 154(b) by 771 days.

(21) Appl. No.: 09/735,944

(22) Filed: Dec. 14, 2000

(65) Prior Publication Data

US 2002/0044620 A1 Apr. 18, 2002

(30) Foreign Application Priority Data

Dec. 17, 1999  (GB) ............................................. 9929769

(51) Int. Cl.[7] ................................................. H04L 7/04
(52) U.S. Cl. ..................... 375/376; 375/326; 375/327; 327/147; 327/148; 327/151
(58) Field of Search ............................... 375/371–376; 370/412, 516; 348/476, 536; 331/34, 1 A; 327/156, 2, 144, 145, 157, 160, 163

(56) References Cited

U.S. PATENT DOCUMENTS

| | | | |
|---|---|---|---|
| 5,036,294 A | * | 7/1991 | McCaslin .................... 331/1 A |
| 5,204,882 A | | 4/1993 | Chao et al. .................. 375/106 |
| 5,260,978 A | | 11/1993 | Fleischer et al. |
| 5,396,492 A | * | 3/1995 | Lien ............................ 370/412 |
| 5,442,324 A | * | 8/1995 | Brauns ......................... 331/34 |
| 5,526,362 A | | 6/1996 | Thompson et al. |
| 5,561,469 A | * | 10/1996 | Schultz ........................ 348/476 |
| 5,602,884 A | | 2/1997 | Wieczorkiewicz et al. |
| 5,608,731 A | | 3/1997 | Upp et al. |
| 5,742,649 A | | 4/1998 | Muntz et al. |
| 5,822,383 A | | 10/1998 | Muntz et al. |
| 5,896,427 A | * | 4/1999 | Muntz et al. ................ 375/372 |
| 6,144,674 A | * | 11/2000 | Peres et al. .................. 370/516 |
| 6,144,714 A | * | 11/2000 | Bleiweiss et al. ............ 375/376 |

FOREIGN PATENT DOCUMENTS

| | | |
|---|---|---|
| EP | 0 369 628 A2 | 10/1989 |
| EP | 0369628 A2 | 5/1990 |
| EP | 0 905 909 A2 | 3/1999 |
| GB | 2 316 557 A | 2/1998 |
| WO | WO 91/07832 | 5/1991 |
| WO | WO 99/38285 | 7/1999 |

OTHER PUBLICATIONS

Lau, Richard C., " Synchronous techniques for timing recovery in BISDN", IEEE Transactions on Communications, vol. 43, 1995, pp. 1810–1818.

* cited by examiner

Primary Examiner—Young T. Tse
Assistant Examiner—Edith Chang
(74) Attorney, Agent, or Firm—Marks & Clerk; Richard J. Mitchell

(57) ABSTRACT

A multimode clock recovery circuit for providing constant bit rate services in a cell relay network has an embedded digital phase locked loop including an input circuit capable of generating a phase signal from at least two types of input signal. The phase signal controlling the output of the phase locked loop generates clock signals for the constant bit rate services.

18 Claims, 4 Drawing Sheets

CLOCK RECOVERY PLL

BACKGROUND OF THE INVENTION

1. Field of the Invention

This invention relates to packet switched networks, and more particularly to a method of clock recovery in cell-relay networks, particularly ATM (Asynchronous Transfer Mode) networks offering constant bit rate services.

2. Brief Description of the Prior Art

AAL1 is the ATM Adaptation Layer for Constant Bit Rate (CBR) services. CBR services carry time sensitive data, such as voice and video. The original clocked (isochronous) data is segmented into ATM cells at the transmitting end, carried over the ATM network, and reassembled into a continuous clocked stream at the receiving end. The receiving end needs to provide a clock for this output data stream, or recover the transmitting end clock.

Various standardized and un-standardized clocking schemes are current used in ATM:

1. Line Rate Clocking: A clock is provided at the receiving end by an incoming data link with the same nominal clock rate as the transmitting end. This incoming clock will often need to be de-jittered before being used, because requirements on outgoing telecom clocks are usually more stringent than requirements on incoming telecom clocks.
2. Network Synchronous Clocking: A telecom clock is recovered from an 8 kHz reference clock. This is preferably a clock which is PRS-traceable (traceable to a Primary Reference Source). Standards for SDT (Structured Data Transfer) AAL1 require that a clock be recovered from the ATM Network clock, which is a multiple of 8 kHz. The 8 kHz must be frequency-multiplied up to the desired rate.
3. Adaptive Clocking: The clock from is recovered from information about the fill level of the receive buffer containing the received segmented data. This buffer serves to even-out the variation of the incoming data versus the receiver-end clock which is reading out the data. This method is referred to in the AAL1 standards as "Adaptive" but the exact method used is not subject to standardization.
4. SRTS Clocking: The clock is recovered from time stamps carried by the ATM cells. The method standardized for AAL1 is referred to as Synchronous Residual Time Stamps (SRTS) and described in U.S. Pat. No. 5,260,978.

In the prior art, external PLL(s) as employed and an algorithm resident in CPU was used adaptive clocking and SRTS.

An object of the present invention is to provide a way of efficiently dealing with all four of these required clocking schemes in one circuit implementation.

SUMMARY OF THE INVENTION

According to the present invention there is provided a multimode clock recovery circuit for providing constant bit rate services in a cell relay network, comprising an embedded digital phase locked loop (PLL) including an input circuit capable of generating a phase signal from at least two types of input signal, said phase signal controlling the output of said phase locked loop to generate clock signals for said constant bit rate services.

ATM Forum af-vtoa-0078.000 and ITU-T 1.363.1 standards require clock recovery using either the Synchronous Residual Time Stamp or adaptive technique. The invention can recover a service clock with the appropriate quality from an incoming clock, received SRTS data or FIFO pointer data. The same PLL is used for all three kinds of inputs thereby providing a gate efficient implementation.

The present invention is primarily concerned with telecom clocks at T1, E1 and J2 rates, as well as TDM bus clocks at 2.048 MHz, 4.096 MHz and 8.192 MHz. The invention is also applicable to DS3 and E3 clock rates.

The clock recovery circuit in accordance with the invention efficiently supports all four clock schemes. The SRTS scheme recovers phase of original clock, not just the frequency.

The Adaptive mode works with Dynamic Bandwidth Circuit Emulation Services (DBCES). With DBCES, the number of DS0 64kbps channels carried by an ATM VC (virtual circuit) can vary (e.g. as voice calls are connected and disconnected). This will vary the inter-arrival times of the cells, as the cells contain either 46 or 47 bytes, but the number of DS0 channels carried by the 46 or 47 bytes vary. This invention can correctly recover timing from the Receive Buffer even as the cell inter-arrival times change.

The invention can also offer an accurate holdover mode in the STRS mode, which is controllable by information derived from received ATM cells. For example, an SRTS time stamp may be detected to be invalid because it is protected with error-detection fields. When the receiver/reassembler flags a SRTS nibble as invalid, the PLL goes into a temporary holdover mode to maintain the clock signal.

The PLL also goes into accurate holdover when the receiver/reassembler buffer underruns due to a lost connection. (When the Receive buffer runs out of TDM data in Adaptive Clocking mode, the PLL is sent a "slow-down" signal, when the ATM VC cell stream stops for a user-programmable length of time, the PLL is automatically put in holdover mode).

The PLL goes into accurate holdover when SRTS cell stream stops (when Receive buffer runs out of new SRTS values, the PLL will automatically go to holdover).

In the Line Rate mode, the PLL to go into accurate holdover mode-when the input data link is determined to be in Loss Of Synchronization state.

When the Dynamic Bandwidth Circuit Emulation Services is used with Adaptive mode, and all DS0 channels are disconnected (the all-idle state), only a few cells are transmitted each second to keep the ATM link alive, but no TDM (Time Division Multiplexed) bytes are transferred. The clock recovery circuit of the invention will automatically go into accurate holdover mode when the all-idle state is detected as defined by the DBCES channel activity bit mask.

The invention can also provide an accurate freerun clock (0.1 ppm with an accurate MCLK master clock), reduced output jitter, large input jitter acceptance (configurable in gates). It also performs SRTS for UDT (standardized) and also SRTS for SDT (non-standard).

The ability to do Line Rate and SRTS Clocking in one PLL means that at the transmitting end the present invention can be used to de-jitter the incoming clock before it is used to generate SRTS time stamps, and at the receiver another instance of the present invention can be used to generate the outgoing clock from the SRTS. This is important, because the sampling effects of the time stamp process will alias the jitter frequencies downward, where they will be harder to filter for the receiver PLL (creating wander).

BRIEF DESCRIPTION OF THE DRAWINGS

The invention will now be described in more detail, by way of example only, with reference to the accompanying drawings, in which;—

DETAILED DESCRIPTION OF THE PREFERRED EMBODIMENTS

Figure 1:
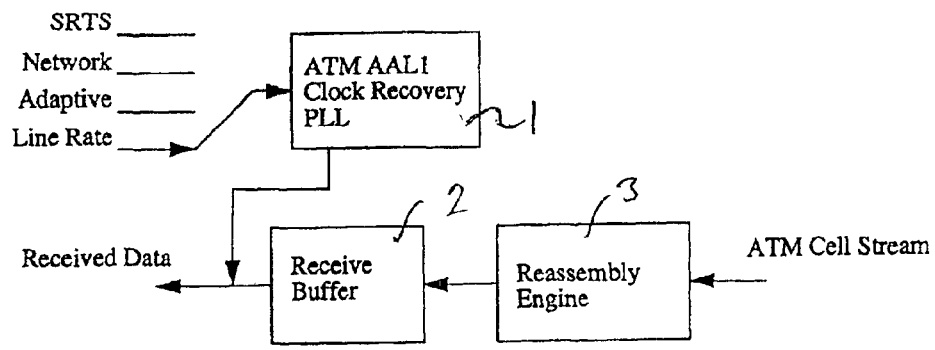
FIG. 1 is a block diagram showing adaptive line rate clocking.

In FIG. 1, the digital phase locked loop (PLL) 1 receiving a line rate input clocks received data out from receive buffer 2. The incoming ATM cell stream is reassembled in reassembly engine 3.

Figure 2:
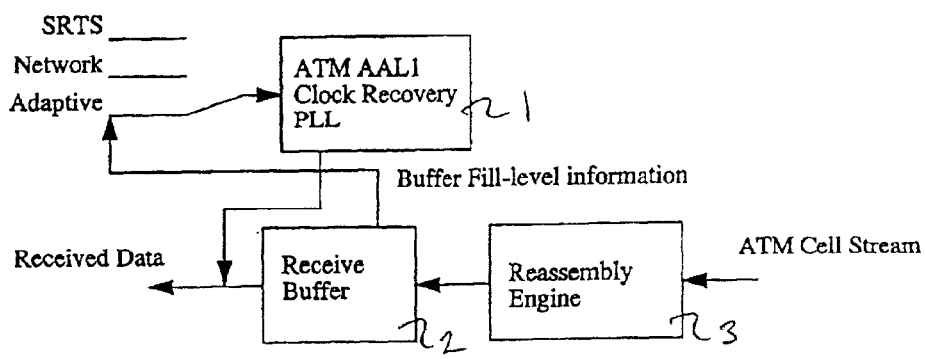
FIG. 2 is a block diagram showing adaptive clock recovery.

In the adaptive scheme shown in FIG. 2, buffer fill-level information is returned from the receive buffer 2 to the input of the PLL 1.

Figure 3:
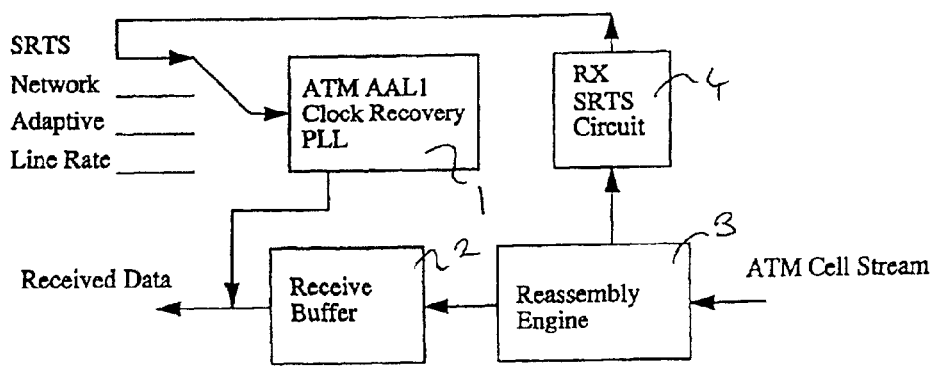
FIG. 3 is a block diagram showing SRTS clock recovery.

In the SRTS scheme shown in FIG. 3, the receive SRTS circuit 4 recovers timing information from the incoming time stamps and provides an input to PLL 1.

Figure 4:
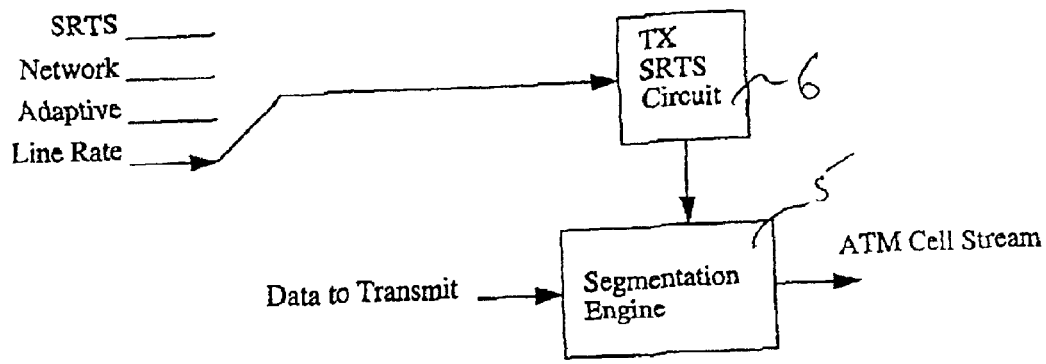
FIG. 4 is a block diagram showing normal transmit SRTS.

In FIG. 4, the line rate input is fed to transmit SRTS circuit 6, which generates residual time stamps to be included in the cell stream by segmentation engine 5.

Figure 5:
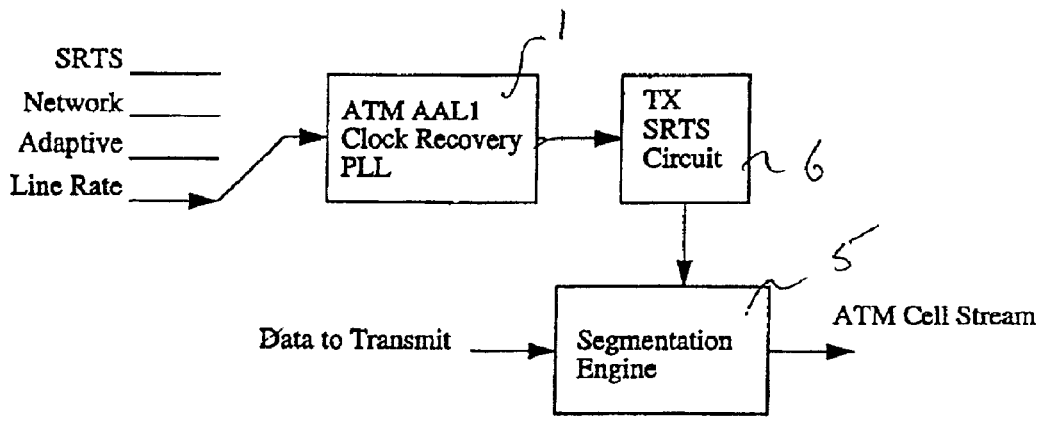
FIG. 5 is a block diagram showing transmit SRTS de-jittering.

By including the clock recovery PLL, as shown in FIG. 5, the circuit can be used to de-jitter an incoming clock before it is used to generate SRTS time stamps, and at the receiver another instance of the circuit can be used to generate the outgoing clock from the SRTS. This is important because the sampling effects of the time stamp process alias the jitter frequencies downward, where they are harder to filter for the receiver PLL, which creates wander.

As noted above, the PLL 1 operates in the following modes:

Synchronous mode: The PLL synchronizes to the incoming clock.

Adaptive mode: Synchronize to the incoming cell stream by monitoring the write and read pointers of the Reassembly Circular Buffer. The PLL receives a phaseword representing: phaseword=write_pointer-read_pointer-average_fill.

SRTS mode: Synchronize to the incoming Synchronous Residual Time Stamps (SRTS). The PLL output clock is fed into a local SRTS generator to generate a local SRTS that is compared to the received SRTS.

Network mode. This mode is similar to Synchronous mode. An 8 kHz clock, generated from the 19.44 MHz or 155.52 MHz network clock, is the input for the PLL. The output can be a line rate cock or an SRTS.

Within the modes listed above, the PLL 1 has another set of basic modes:

Normal mode: The PLL synchronizes using the appropriate input signal (i.e., clock, SRTS, FIFO phaseword or 8 kHz network clock).

Holdover mode: The PLL no longer uses the input signal, but holds to its current output frequency. When LOS becomes active, the PLL is switched to holdover mode. The user can also switch the PLL into holdover mode.

Freerun mode: No input is used. The master clock accuracy determines the output clock accuracy.

Figure 6:
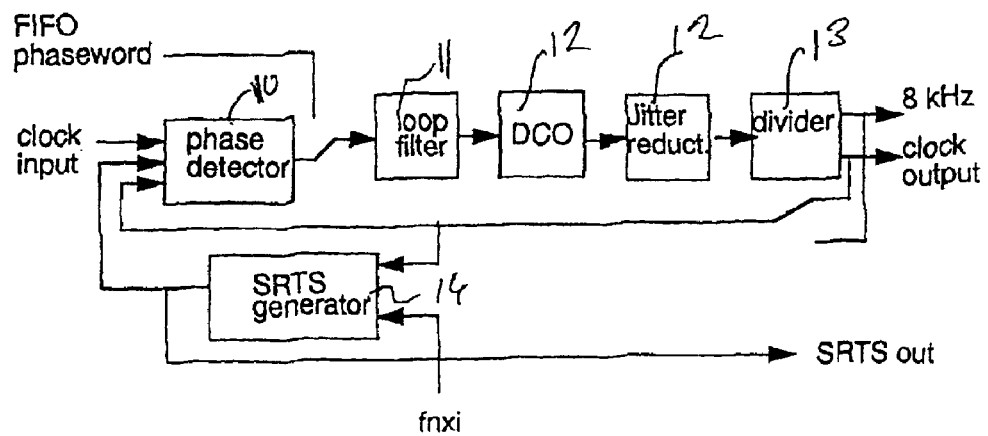
FIG. 6 is a block diagram of the digital PLL.

The digital PLL 1 must provide a clock synchronous to some input signal. Because there are several types of incoming signals to synchronize to (such as clocks, SRTS data and arriving ATM cells), the PLL needs to be capable of accepting various types of input. The basic PLL architecture, however, is the same for all situations. As shown in FIG. 6, it consists of a phase detector 10, a loop filter 11, a digital controlled oscillator 12, an intrinsic jitter reduction circuit 12 and a divider 13.

Parameters such as locking range, center frequency, transfer, accuracy, etc. can be configured/programmed easily in the circuit. In addition, features like freerun and holdover mode can be built in. When the system clock is high enough, no analog circuitry is needed to meet the output jitter requirements.

A divider on the 19.44 MHz or 155.52 MHz network reference (not shown) provides the local residual time stamp, as defined in U.S. Pat. No. 5,260,978 noted above.

The PLL must generate frequencies with an accuracy as stated in Table 12. The accuracy defines the freerun accuracy and the locking range of the PLL. The accuracy of mclk must be incorporated in these calculations. A freerun accuracy of approximately 0.2 ppm and a locking range of approximately 160 ppm is suggested, thereby allowing 100 ppm mclk accuracy. For DS1, the locking range is approximately 245 ppm, thereby supporting older systems with a 130 ppm frequency accuracy.

TABLE 12

Center Frequency and Required Accuracy

| Clock | Frequency | Accuracy | 1 UI |
|---|---|---|---|
| DS1 | 1.544 MHz | +/− 32 ppm | 648 ns |
| E1 | 2.048 MHz | +/− 50 ppm | 488 ns |
| C4M | 4.096 MHz |  | 244 ns |
| J2 | 6.312 MHz | +/− 30 ppm | 158 ns |
| C8M | 8.192 MHz |  | 122 ns |

The af-vtoa-0078.000 standard with respect to jitter and wander points to several ANSI and ITU-T standards, as summarized in the Table below. The jitter requirements must be met in all clocking modes. The wander requirements may not be met in adaptive mode.

| | Relevant Specifications | | |
|---|---|---|---|
| Clock | Electrical | Jitter | Wander |
| DS1 | ITU-T G.703 | ANSI DS1.102 ANSI DS1.403 ITU-T G.824 | ANSI DS1.403 ITU-T G.824 |
| E1 | ITU-T G.703 | ITU-T G.823 | ITU-T G.823 |
| J2 | ITU-T G.703 | ANSI DS1.102 JT-G.703a | JT-G.703a, |

Jitter transfer functions are not specified in the above standards. However, some ITU-T specs. regarding digital multiplex equipment, such as G.743, specify jitter transfer functions. For the MT9042, the requirement is that the jitter transfer corner frequency be between 1.2 and 2.0 Hz (ETSI spec.), with a 20 dB/dec roll off. This range is used for this PLL for all input frequencies and meets the requirements of G.743. The jitter transfer is less than +0.5 dB.

The standards from the above Table specify wander/jitter input tolerance and maximum output jitter. For the input wander/jitter tolerance, the low frequency parts are the largest and are therefore the most important for the PLL requirements (see the Table below). With a corner frequency larger than 1.2 Hz, it is assumed that the PLL follows wander below 0.1 Hz. The range of the phase detector is therefore based upon the wander tolerance at 0.1 Hz and is 32 UI peak-to-peak (+/−16 UI).

Minimum Input Wander and Jitter Tolerance

| Clock | A0[$Ui_{pp}$] | A1[$Ui_{pp}$] | F0[Hz]F1[Hz] @ 0.1Hz[$UI_{pp}$] | |
|---|---|---|---|---|
| DS1 | 28 | 5 | 1.2E-5 10 | 6.2 |
| E1 | 37 | 18 | 1.2E-5 20 | 23 |
| J2 | 114 | 5 | 1.2E-5 10 | 15 |

The maximum output jitter on the output of the PLL as specified in the appropriate standards is listed in the Table below.

Maximum Allowed Output Jitter

| Clock | A[$UI_{pp}$] | A[ns] |
|---|---|---|
| DS1 | 0.07 | 45 |
| E1 | 0.2 | 98 |
| J2 | 0.1 | 16 |

ANSI DS1.403 and DS1.101 require that the output phase change no more than 81 ns per 1.326 ms. The maximum allowable output phase shift with respect to the ideal reference source is 1 μs. Therefore, the slew rate of the DCO input may be no more than 61 ppm of the center frequency setting. The "no more than 81 ns/1.326 ms" requirement is met for all modes.

Because the period of the E1/DS1/J2/C4/C8 signals is less than 1 μs, that requirement is met automatically when the PLL is in synchronous mode. When switching between modes, the 1 μs MTIE is not met.

Figure 7:
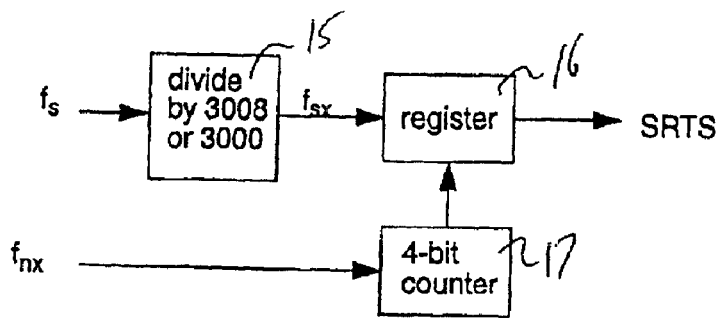
FIG. 7 is a block diagram of the SRTS generator.

The SRTS generator 14, shown in FIG. 7, is the same as the standard solution indicated in ITU standard 1.363.1 and described U.S. Pat. No. 5,260,978, which is simple, small and efficient. In master mode, the SRTS generator is needed to generate an RTS (residual time stamp) that is transmitted. In slave mode, the SRTS generator is placed in the feedback loop of the PLL to synchronize on the incoming RTS. The SRTS generator consists of a divider 15, a four bit counter 17 and a register 16. The SRTS is in effect the remainder resulting from dividing the network clock fnx into the service clock fs divided by a suitable number, 3000 or 3008.

The maximum jitter allowed on $f_s$ and $f_{nx}$ is such that ($f_{sx}/f_{nx}$)MOD16 remains constant under all circumstances. Otherwise, the basic principle of the SRTS method is violated. $f_s$ comes from the PLL and is thereby clean enough. For $f_{nx}$, the user is responsible for the quality of the provided network clock. If it's not good enough, it must first be filtered with an external PLL.

The phase detector 10 must extract a phase difference value from its two input signals. There are two cases two consider. In one case the inputs are RTS values as inputs. In the other case the inputs are clock inputs. Both cases require different phase detectors, although certain parts can be shared.

In the case of RTS as input values, the output phaseword is the difference of the input values. However, because both input values come from counters, a modulo function is incorporated in these values. That gives false behaviour when one of the input values wrap around because instead of continually with increasing phase difference, the phase output drops back to its minimum value before increasing again, giving a sawtooth effect. This effect can be cancelled by using the wrap-around event to control an up/down counter, which in effect keeps track of the number of wrap-arounds. This up/down counter does not wrap around, since otherwise it would re-introduce the same problem. The value of the up/down counter gets a weight of 16 and is added to the SRTS difference. Thus when the first four-bit counter fills up, the up/down counter increments by 1 and adds a weight of sixteen to the four-bit counter output so that the next value from the four-bit counter is treated as seventeen, not one. In this way, the sawtooth effect can be avoided.

Figure 8:
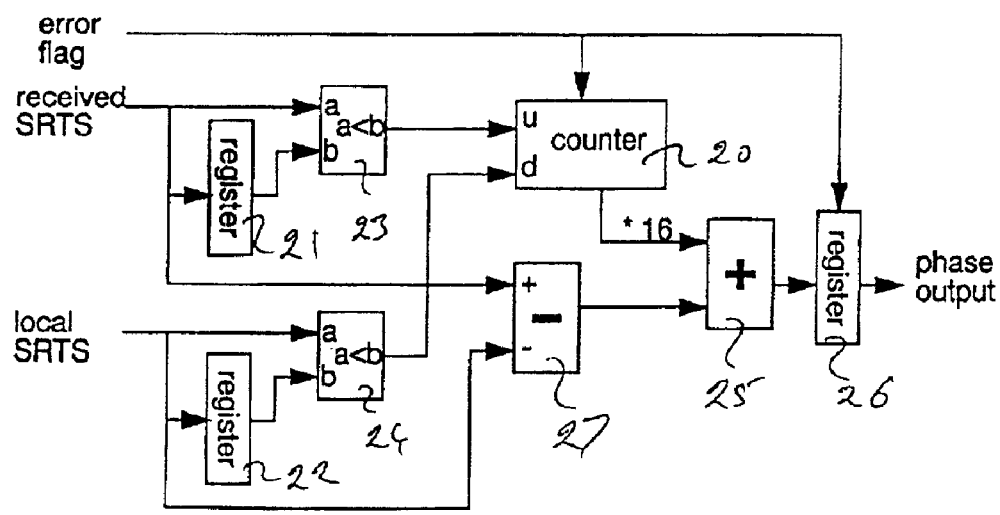
FIG. 8 is a block diagram of the phase detector for SRTS inputs.

The block diagram of the phase detector for SRTS values is given in FIG. 8. It consists of delay registers 21, 22 comparators 23, 24, up/down counter 20, difference circuit 27, accumulator 25, and output register 26.

Because the "carry" of the RTS is not available from the counter 20, it has to be regenerated locally. This can be done by comparing the current RTS with the previous RTS stored in registers 21, 22. If the current RTS is smaller, a carry is generated. Bit errors in the received RTS may cause false carries and thereby cause cycle slips. A cycle slip results in wander on the output of $3008/f_s$ seconds (for example, 1.47 ms @ E1 rates), which is unacceptable. An extra bit from the SRTS FIFO indicates whether an error was detected on the SRTS reassembly. In that case, both the corrupted received RTS and the local FITS is ignored by disabling the counter and the register.

This architecture has the advantage of offering phase recovery as well as frequency recovery; large input phase domain of $2^n UI_{pp}$, where n is the width of the counter in bits, large input jitter acceptance, and fast locking of the PLL with no creeping behaviour. Although it works directly on the residual time stamp, the circuitry in effect produces a phase output dependent on the difference between the actual timestamps.

Figure 9:
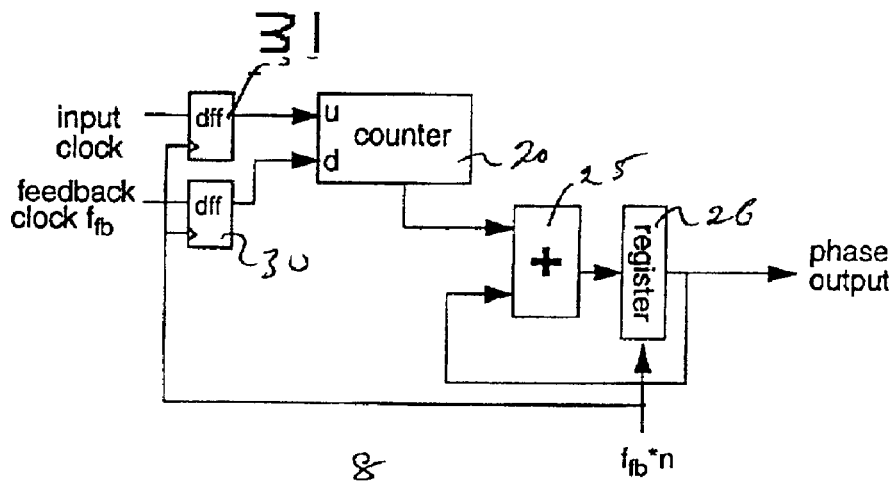
FIG. 9 is a block diagram of the phase detector for clock inputs.

For clock inputs, the phase detector block diagram is shown in FIG. 9. This consists of difference circuits 30, 31, up/down counter 20, accumulator 25 and register 26. The register 26 stores the phase output. This is clock by a signal $f_{fb*n}$, where $f_{fb}$ is the feedback signal an n is a multiplier, typically 8. n determines the granularity of the output.

The phase value is in the time domain now. Because the input clock has a relatively low frequency (compared to mclk), a higher clock can be used to detect the phase difference between the input clock and the feedback clock resulting in decreased granularity and thus greater accuracy. This higher clock is also a feedback clock from the PLL 1. It samples the input clocks (synchronous detection) and therefore must be at least 2 times the highest input frequency. Because of jitter and frequency offsets on the input clock, this higher clock frequency is four times the nominal input clock frequency for J2, C4M and C8M and 8 times the nominal input clock frequency for DS1 and E1. This configuration has the same advantages as mentioned for the SRTS phase detector. The up/down counter 20 determines the jitter acceptance of the PLL 1 measured in UI (Unit Intervals). A jitter acceptance of 32 UI would mean a 5-bit counter. The counter does not wrap around to avoid the sawtooth effect noted above. This will increase the locking speed during phase acquisition. Of course the range of the accumulator must be such that no overflow occurs under any circumstances. For clock inputs, the same advantages of this architecture apply as for SRTS inputs.

Figure 10:
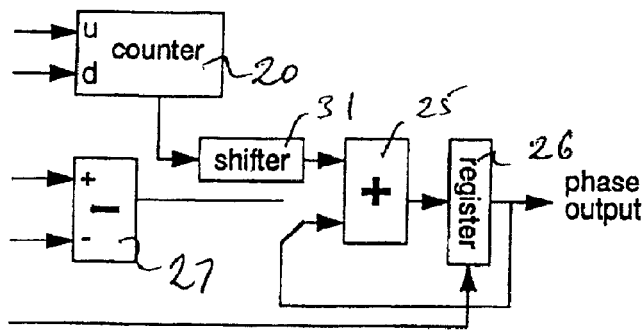
FIG. 10 shows a combined phase detector for both kinds of inputs.

The diagrams for the Phase Detector can be combined to one, as is shown in FIG. 10. Up/down counter is passed through shifter 31 to register 26. The shifter adjusts the weight of the counter 20 to sixteen in SRTS mode and one in synchronous mode.

In the adaptive mode, the phase detector 10 is not used. A Circular Buffer in the reassembly engine 3 generates a signed 2's complement phaseword where phaseword= write_pointer-read_pointer- "average". "Average" is programmed by the user. This phaseword is used as the filter phase input instead of the phase output from the phase detector.

Figure 11:
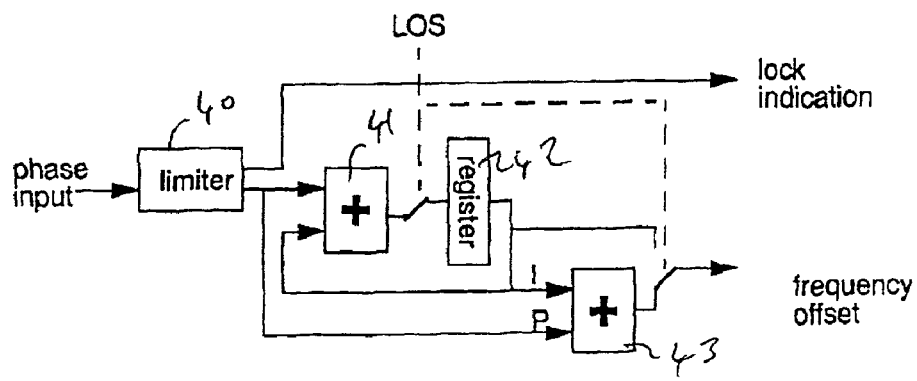
FIG. 11 is a block diagram of the loop filter.

The loop filter 11 determines mainly the jitter transfer of the PLL 1. In addition, the PLL type, the locking range, and the phase alignment speed are determined in the loop filter 11. If a holdover mode is needed, it is built into the loop filter. The general block diagram is given in FIG. 11. It consists of a limiter 40, adder 41, register 42, and adder 43. This filter has first order low pass behaviour. Because of the accumulator, the PLL is of type 2. The path starts with a limiter which limits the input phase value to approx. 40 ppm of the center frequency value and thereby limiting the phase alignment to approximately 5 ns/125 $\mu$s. A flag which indicates whether the limiter is actually limiting can be used for lock indication. Then the limited phase is accumulated (adder & register) to a frequency offset from the center frequency. The accumulator may not wrap around and its range determines the locking range of the PLL.

In holdover mode the phase, i.e. when LOS is active, the output of register 42 is no longer accumulated, but the value in the register 42 is used as the frequency offset. The I(ntegral) and P(roportional) values are added with different weights (P>>I). The difference in weight determines the damping of the loop. Because P is much larger than I, short term phase variations (jitter) are mainly corrected through the P path while long term phase variations (frequency variations) are mainly corrected through the I path.

Figure 12:
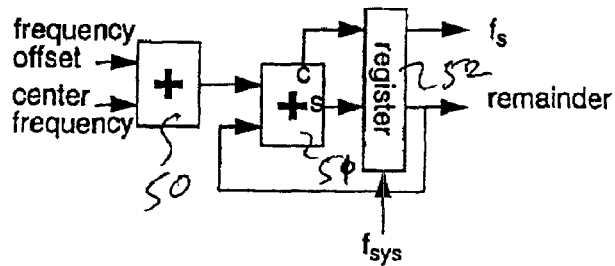
FIG. 12 is a block diagram of the digital controlled oscillator.

The DCO 12 is basically an accumulator as shown in FIG. 12. It consists of an adder 50, an adder 51, and a register 52. To modulate it, a frequency offset is added to the center frequency value. The carry output has the desired frequency which is a function of the accumulated value and the system clock frequency. For a given clock frequency and accumulator width, the output frequency can only have discrete values. Therefore, the desired output frequency has a limited accuracy.

The remaining value in the accumulator at a carry, the rest_term, represents the exact phase error of the carry pulse with respect to an ideal signal. The error is maximally 1 /$f_{sys}$ and is the intrinsic jitter of the DCO. Increasing $f_{sys}$ reduces the intrinsic jitter. The rest_term can be used to correct the phase of the carry pulse, thereby reducing the intrinsic jitter. $f_{sys}$ is high enough (>64 MHz) to meet the jitter specs of 0.1 UI for DS1, E1 and J2 without much effort. An overview for a DCO with a clock frequency of 66 MHz is given in the table below.

| DCO Freerun Clocks and Accuracies. | | | |
|---|---|---|---|
| Clock | $f_s$[MHz] | $f_{dco}$[MHz] | Accuracy[ppm] |
| DS1 | 1.544 | 12.352 | 0.05 |
| E1 | 2.048 | 16.384 | −0.13 |
| C4M | 4.096 | 16.384 | −0.13 |
| J2 | 6.312 | 25.284 | −0.03 |
| C8M | 8.192 | 32.768 | 0.05 |

Figure 13:
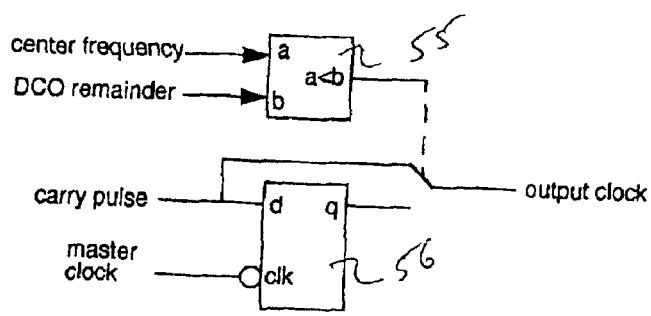
FIG. 13 is a block diagram of the jitter reduction circuit.

The jitter reduction circuit 12 is shown in FIG. 13. This consists of a comparator 55 and a DQ flip-flop 56. The intrinsic jitter of the DCO output is normally 1/mclk. With the use of the negative edge of the master clock, the intrinsic jitter can be reduced to half of that. When the rest term is smaller than half the center frequency value, the carry pulse is delayed by half a master clock cycle. When the rest term is greater than or equals half the center frequency value the carry pulse is not delayed.

In the case that mclk=66 MHz with a 40–60% duty cycle, the output jitter would be maximally 9 ns. The spectrum of the jitter ranges from 0 Hz to $f_{dco}/2$. With this jitter reduction circuit, the following intrinsic output jitter values would be achieved:

| Intrinsic Output Jitter @ mclk = 66 MHz, 40–60% duty cycle. | | |
|---|---|---|
| Clock | DCO Output Jitter [UI] | Reduced Output Jitter [UI] |
| DS1 | 0.02 | 0.01 |
| E1 | 0.03 | 0.02 |
| C4M | 0.06 | 0.04 |
| C8M | 0.12 | 0.07 |
| J2 | 0.09 | 0.06 |

The output divider 13 divides the DCO output frequency down to the required outputs. A standard counter is necessary to do the job. For the generation of the 8 kHz output, a loadable counter is needed to do the division from E1/DS1/J2 to 8 kHz. Some additional circuitry can be added to generate the right frame pulse format.

The described clock recovery circuit is efficient and versatile, capable of operating in four modes. It can be used with or without multiple selectable center frequencies, with or without a center frequency programmed as a register from an microprocessor, with or without a mode where the integrating register can be read by a microprocessor, with or without a mode where a microprocessor can adjust the center frequency based on an algorithm tied to the values read from the integration register (i.e. a mode where a microprocessor is used as a controller of the feedback loop of the PLL, giving longer time constants than can easily be achieved in hardware), with or without a jitter reduction circuit, with different master clock (MCLK) frequencies, and with a jitter reduction circuit based on the negative clock edge, or with a jitter reduction circuit based on a tapped delay line. Various PLL parameters can be changed without departing from the spirit of the present invention, including: center frequency, locking range, input jitter tolerance, jitter transfer function, max phase slope. It can be used with or without automatic switch-over to holdover passed on validity of received SRTS nibbles, and with or without automatic switch-over to holdover passed on underun due to lost ATM connection.

It can also be used for mode conversion, as an intermediate node, to convert received adaptive clocking to transmit SRTS clocking, using the circuit of FIG. 5, by making the input the adaptive input. It can be used for T1 to E1 conversion with an extra circuit, and it is also applicable to DS3 and E3 rates. It can also work in conjunction with another PLL (internal or external to the IC).

We claim:

1. A multimode clock recovery circuit for use in the provision of constant bit rate services in a cell relay network, comprising:

a digital phase locked loop including a digital controlled oscillator for generating an output signal, a loop filter responsive to a phase signal to control said digital controlled oscillator, and a phase detector having multiple inputs for receiving different types of input signal;

said phase detector comparing an input signal applied to any of said multiple inputs with said output signal to develop said phase signal;

a local Synchronous Residual Time Stamps (SRTS) generator for generating time stamps from said output signal connected to one of said multiple inputs of said phase detector;

said phase detector in a SRTS mode developing said phase signal from said locally generated time stamps and time stamps received over said cell relay network;

another of said multiple inputs of said phase detector being adapted to receive a line rate clock signal;

said phase detector in a line rate mode developing said phase signal from said line rate clock signal and said output signal; and a receive buffer for receiving incoming cells that in an adaptive mode develops said phase signal from a state of said receive buffer and applies said phase signal developed by said receive buffer to said loop filter to control said digital controlled oscillator.

2. A multimode clock recovery circuit as claimed in claim 1, wherein said receive buffer develops said phase signal in the form of a phaseword based on a fill level thereof.

3. A multimode clock recovery circuit as claimed in claim 2, wherein said phaseord is derived from a write_pointer-read_pointer-average of said receive buffer, where said average is programmed by a user.

4. A multimode clock recovery circuit as claimed in claim 1, wherein the phase locked loop goes into a holdover mode when any of the following conditions occur: the receiver buffer runs out of SRTS values in the SRTS mode, a virtual circuit through said network times out, and loss of synchronization is asserted in the line rate mode.

5. A multimode clock recovery circuit as claimed in claim 1, wherein said phase detector comprises a common up/down counter for developing said phase signal in said SRTS mode and said line rate mode.

6. A multimode clock recovery circuit as claimed in claim 5, wherein an output of said common up/down counter is fed to an accumulator.

7. A multimode clock recovery circuit as claimed in claim 6, comprising a shifter for adjusting the weight of the output of said common up/down counter.

8. A multimode clock recovery circuit as claimed in claim 7, wherein said shifter adjusts the weight of said common up/down counter according to whether said recovery circuit is in said SRTS mode or said line rate mode.

9. A multimode clock recovery circuit as claimed in claim 8, wherein said shifter sets the weight of said common up/down counter to sixteen for a time stamp signal and one for a clock signal.

10. A multimode clock recovery circuit as claimed in claim 1, wherein said phase detector comprises first and second difference circuits, each receiving at first and second inputs thereof current time stamps and delayed time stamps, said first difference circuit receiving time stamps from said cell relay network and said second difference circuit receiving time stamps generated by said local SRTS generator, said first and second difference circuits providing respective inputs to an up/down counter, a subtractor having inputs for respectively receiving time stamps received over said cell relay network and time stamps generated by said local SRTS generator, and an accumulator for receiving the outputs of said subtractor and said up/down counter to develop said phase signal.

11. A multimode clock recovery circuit as claimed in claim 10, wherein the output of said up/down counter is weighted.

12. A multimode clock recovery circuit as claimed in claim 11, wherein said up/down counter is a non wrap around counter.

13. A multimode clock recovery circuit as claimed in claim 1, wherein said local SRTS generator comprises a divider for receiving a feedback signal from the output of the phase locked loop, a counter for receiving a network clock signal, and a register for generating local SRTS time stamps.

14. A multimode clock recovery circuit as claimed in claim 1, wherein the phase locked loop goes into a holdover mold wherein the output of the phase locked loop remains constant when a valid input signal is lost as to maintain a constant frequency based on the last valid input signal.

15. A multimode clock recovery circuit for use in providing constant bit rate services in a cell relay network, comprising a phase detector having multiple inputs, a loop filter receiving the output of said phase detector, a digital controlled oscillator receiving the output of said loop filter, a jitter reduction circuit receiving the output of said digital controlled oscillator, a divider receiving the output of said jitter reduction circuit, and a local Synchronous Residual Time Stamps (SRTS) generator in a feedback loop connected to one of said multiple inputs of said phase detector, said local SRTS generator generating local time stamps derived from the output of said digital controlled oscillator, and said phase detector developing a phase signal for controlling said digital controlied oscillator from said local time stamps and time stamps received from said cell relay network, and wherein said local SRTS generator includes a wrap-around counter, said phase signal is developed from the difference between the time stamps received from said local SRTS generator and said time stamps received over said cell relay network, and said phase detector includes a weighted non-wrap around up/down counter having an output that is added to said difference.

16. A phase detector for recovering clock signals from received time stamps in a cell relay network providing constant bit rate services, comprising a first input for receiving a remote time stamp signal, a second input for receiving a locally generated time stamp signal, comparators for comparing the current time stamps of said first input and said second input with the previous time stamps of said first input and second input to generate, a weighted non-wrap around up/down counter receiving the outputs of said respective comparators, a subtractor for deriving the difference between said remote time stamp signal and said locally generated time stamp and an accumulator for adding the output of said subtractor to the output of said weighted non-wrap around up/down counter to generate a phase output signal for controlling a digital controlled oscillator.

17. A phase detector as claimed in claim 16, having an error input for receiving an error flag to generate the phase output signal.

18. A phase detector as claimed in claim 16, further comprising a register connected to the output of said accumulator for temporarily storing the phase output signal.

* * * * *